United States Patent [19]

Hartsell et al.

[11] Patent Number: 5,455,432

[45] Date of Patent: Oct. 3, 1995

[54] DIAMOND SEMICONDUCTOR DEVICE WITH CARBIDE INTERLAYER

[75] Inventors: Michelle L. Hartsell; David L. Dreifus; Bradley A. Fox, all of Cary, N.C.

[73] Assignee: Kobe Steel USA, Research Triangle Park, N.C.

[21] Appl. No.: 321,164

[22] Filed: Oct. 11, 1994

[51] Int. Cl.[6] .......................... H01L 29/80; H01L 23/48; H01L 27/02

[52] U.S. Cl. .............. 257/77; 257/76; 257/347; 257/411; 257/462

[58] Field of Search .................. 257/76, 77, 268, 257/347, 352, 411, 462

[56] References Cited

U.S. PATENT DOCUMENTS

| | | | |
|---|---|---|---|
| 4,960,751 | 10/1990 | Yamazaki | 505/1 |
| 4,981,818 | 1/1991 | Anthony et al. | 437/233 |
| 5,072,264 | 12/1991 | Jones | 357/22 |
| 5,107,315 | 4/1992 | Kumagai et al. | 357/23.15 |
| 5,114,871 | 5/1992 | Jones | 437/41 |
| 5,254,862 | 10/1993 | Das et al. | 257/77 |
| 5,294,814 | 3/1994 | Das | 257/77 |
| 5,298,765 | 3/1994 | Nishimura | 257/77 |
| 5,384,470 | 1/1995 | Tachibana et al. | 257/77 |

FOREIGN PATENT DOCUMENTS

4-196489  10/1992  Japan .

OTHER PUBLICATIONS

M. Marchywka, et al., "*Observation of charge storage in diamond MIS capacitors*", Electronics Letters, vol. 30, No. 4, Feb. 17, 1994, pp. 365–366.

Mike Marchywka, et al., "*Band–Edge Photoresponse Characteristics of Diamond MSM's*", Mat. Res. Soc. Symp. Proc., vol. 302, 1993, pp. 311–316.

S. C. Binari, et al., "*Diamond metal–semiconductor–metal ultraviolet photodetectors*", Diamond and Related Materials, 2 (1993), pp. 1020–1023.

S. A. Grot, et al., "*Diamond Thin–Film Recessed Gate Field–Effect Transistors Fabricated by Electron Cyclotron Resonance Plasma Etching*", IEEE Electron Device Letters, vol. 13, No. 9, Sep. 1992, pp. 462–464.

A. J. Tessmer, et al., "*Polycrystalline diamond field–effect transistors*", Diamond and Related Materials, 1 (1992), pp. 89–92.

W. Tsai, et al., "*Diamond MESFET Using Ultrashallow RTP Boron Doping*", IEEE Electron Device Letters, vol. 12, No. 4, Apr. 1991, pp. 157–159.

Gennady Sh. Gildenblat, et al., "*High–Temperature Thin–Film Diamond Field–Effect Transistor Fabricated Using a Selective Growth Method*", IEEE Electron Device Letters, vol. 12, No. 2, Feb. 1991, pp. 37–39.

(List continued on next page.)

Primary Examiner—Mahshid Saadat
Attorney, Agent, or Firm—Bell, Seltzer, Park & Gibson

[57] ABSTRACT

A diamond semiconductor device with a carbide interlayer includes a diamond layer having a semiconducting diamond region of first conductivity type therein and an insulated gate structure on a face of the diamond layer. The relatively thin carbide interfacial layer is provided between the insulated gate structure and the diamond layer in order to inhibit the formation of electrically active defects, such as interface states at the face. By inhibiting the formation of interface states at the face, the carbide interfacial layer suppresses parasitic leakage of charge carriers from the diamond layer to the insulated gate structure. The carbide interfacial layer can be intrinsic silicon carbide or an intrinsic refractory metal carbide (e.g., TiC or WC) or the layer can be of opposite conductivity type to thereby form a P—N heterojunction with the diamond layer. The carbide interfacial layer and the insulated gate structure can be used in a variety of diamond electronic devices such as MIS capacitors, enhancement-mode and buried-channel insulated-gate field effect transistors (IGFETs), surface-channel and buried-channel charge-coupled devices (CCDs), detectors, heterojunction devices, and other related field effect devices. Related fabrication methods are also disclosed.

26 Claims, 6 Drawing Sheets

OTHER PUBLICATIONS

S. M. Sze, *Physics of Semiconductor Devices*, John Wiley & Sons, 1981, pp. 412–413, 464–468.

Mike Marchywka, et al., *Development of Integrating Radiation Imagers with Diamond MIS Devices*, SPIE, Diamond–Film Semiconductors, vol. 2151, (1994) pp. 110–120.

Mike Marchywka, et al., *Diamond MIS Capacitors for Integrating Radiation Detection*, Conference paper, Saitama, Japan, Aug. 1993.

DIAMOND SEMICONDUCTOR DEVICE WITH CARBIDE INTERLAYER

FIELD OF THE INVENTION

The present invention relates to semiconductor devices and more particularly to semiconductor devices having semiconducting diamond active regions.

BACKGROUND OF THE INVENTION

Electronic devices fabricated from semiconducting diamond offer significant potential for high power and high frequency device applications. This is because diamond possesses a preferred combination of properties such as wide bandgap (5.5 eV), high electron and hole mobility (2000 cm$^2$ V$^{-1}$ sec$^{-1}$), high electron saturation velocity (2×10$^7$ cm sec$^{-1}$) and high breakdown voltage (10$^7$ V cm$^{-1}$), as compared to other conventional semiconductors such as silicon, germanium and gallium arsenide.

Examples of electronic devices formed in diamond include U.S. Pat. No. 5,072,264 to Jones entitled *"Diamond Transistor and Method of Manufacture Thereof"*, which discloses diamond MISFETs and MESFETs. In particular, the Jones patent discloses a diamond MISFET having a wide bandgap insulating region on a p-type diamond substrate and a metallic layer on the insulating region. U.S. Pat. No. 5,114,871 to Jones entitled *"Manufacturing Diamond Electronic Devices"* also discloses a method of manufacturing a diamond MISFET having a p-type diamond substrate and an insulating layer and metal layer thereon. U.S. Pat. No. 5,107,315 to Kumagai et al. entitled *"MIS Type Diamond Field-Effect-Transistor With A Diamond Insulator Undercoat"* further discloses a diamond MISFET on a diamond insulator undercoat. Polycrystalline diamond MOSFETs are also disclosed in an article by A. J. Tessmer, K. Das and coinventor D. L. Dreifus entitled *Polycrystalline diamond field-effect transistors,* Diamond and Related Materials, (1992), pp. 89–92.

Unfortunately, devices having MIS gate structures formed on semiconducting diamond typically suffer from parasitic effects such as high leakage currents across or parallel to the semiconducting diamond/MIS gate structure interface. These parasitic effects can also inhibit complete turn-off and accumulation mode operation of FETs, as described in articles by G. Sh. Gildenblat and S. A. Grot et al. entitled: *"High Temperature Thin-Film Diamond Field-Effect Transistor Fabricated Using a Selective Growth Method"*, IEEE Electron Device Letters, Vol. 12, No. 2, (1991), pp. 37–39; and *"Diamond Thin-Film Recessed Gate Field-Effect Transistors Fabricated by Electron Cyclotron Resonance Plasma Etching"*, IEEE Electron Device Letters, Vol. 13, No. 9, (1992), pp. 462–464. These articles also disclose that parasitic conduction is a common feature in such conventional diamond FETs, but the physical cause is unknown and under investigation.

Thus, notwithstanding the above described attempts to fabricate diamond semiconductor devices having MIS gate structures, there continues to be need for diamond semiconductor devices which have MIS gate structures thereon, but also have substantially reduced parasitic effects.

SUMMARY OF THE INVENTION

In view of the foregoing background, it is therefore an object of the present invention to provide a diamond semiconductor device and associated method of forming the device with reduced interface parasitic effects.

It is a further object of the present invention to provide a diamond semiconductor device operable in an accumulation mode.

These and other objects, advantages and features of the present invention are provided by a semiconductor device which in one embodiment includes a diamond layer having a semiconducting diamond active region therein and insulated biasing means, positioned adjacent the diamond layer, for establishing an accumulation region of charge carriers in the active region in response to a potential bias. The semiconductor device also includes means, adjacent the semiconducting diamond active region, for inhibiting parasitic conduction of the charge carriers from the accumulation layer to the insulated biasing means upon the application of the potential bias.

Preferably, the parasitic conduction inhibiting means is provided by a carbide interfacial layer to inhibit the formation of electrically active defects, such as parasitic interface states between the insulated biasing means and the semiconducting diamond active region. The carbide interfacial layer is preferably silicon carbide (SIC) or a refractory metal carbide such as titanium carbide (TIC) and tungsten carbide (WC). The carbide interfacial layer may have a thickness in the range of about one monolayer to 10 μm and more preferably in the range of 10–10,000 Å to thereby also promote adhesion between the semiconducting diamond layer and the insulated biasing means. The carbide layer may also be semiconducting to serve as an active region of the device. The insulated biasing means preferably includes an electrically conductive layer and an insulating layer on the carbide interfacial layer. The insulating layer may be an oxide or intrinsic diamond; and the conductive layer may be a metal such as gold, aluminum, platinum, titanium and alloys thereof, or a relatively highly doped semiconductor, such as silicon or diamond.

Semiconductor devices according to the present invention may include capacitors, enhancement-mode and buried-channel insulated-gate field effect transistors (IGFETs), surface-channel and buried-channel charge-coupled devices (CCDs), detectors, heterojunction devices, and other related field effect devices having an MIS structure on a semiconducting diamond active region. Accordingly, each device includes a multi-layered conductor/insulator/carbide structure on semiconducting diamond to reduce various interface parasitics.

The present invention also includes a method of forming a diamond semiconductor device which may be advantageously operated in an accumulation mode. The method preferably includes the steps of forming a diamond layer containing a semiconducting diamond active region therein and forming a carbide interfacial layer on the diamond layer. An insulating layer is formed on the carbide interfacial layer and then a following step of forming a conductive layer on the insulating layer is performed. The carbide interfacial layer forming step preferably includes the steps of forming a layer of carbide forming material on the diamond active region and then converting the carbide forming material to a carbide, such as silicon carbide (SIC), or a refractory metal carbide such as titanium carbide (TIC), for example. The converting step may include the step of annealing the carbide forming material. Alternatively, the carbide interfacial layer may be formed by depositing or similarly applying a carbide layer directly on the diamond active region.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout, and prime notation is used to indicate similar elements in alternate embodiments.

Figure 1:
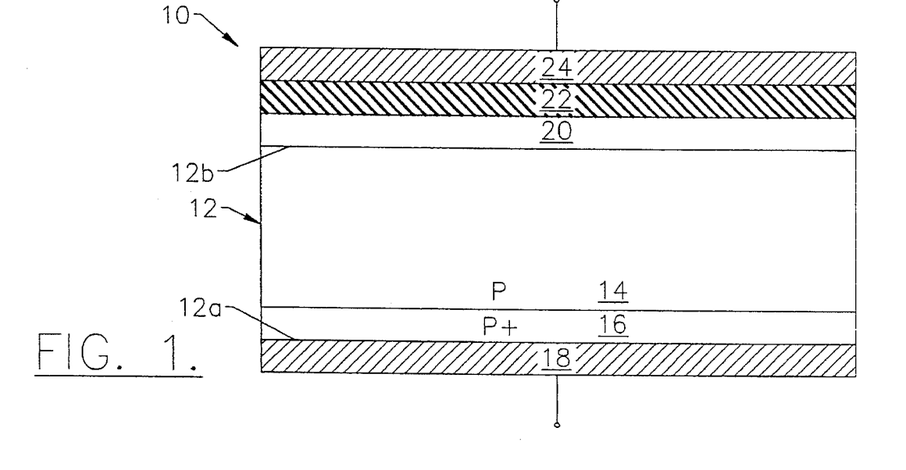
FIG. 1 is a schematic cross-sectional view of an MIS capacitor according to the invention.

Referring now to FIG. 1, an MIS capacitor 10 according to the present invention is illustrated. The MIS capacitor may be used, for example, as an integrating photodetector as would be readily understood by those skilled in the art. The MIS capacitor 10 includes a semiconducting diamond substrate 12 having a diamond active region 14 of first conductivity type therein (shown as P-type) and a degenerately doped diamond contact region 16 of first conductivity type (shown as P$^+$) at a first face 12a of the diamond substrate 12. A first contact layer 18 is also provided at the first face 12a and ohmically contacts the diamond contact region 16. An electrically insulating layer 22 and second contact layer 24 are also provided on the second face 12b, as illustrated. The electrically insulating layer 22 may be an oxide such as SiO$_2$ or a similar dielectric. The insulating layer 22 may also be a wide bandgap insulator such as intrinsic or undoped diamond. The first and second contact layers 18 and 24 may also be metals such as gold, aluminum, platinum, titanium and alloys thereof.

As will be understood by those skilled in the art, the application of a first potential bias across the first and second contact layers 18 and 24, respectively, will induce the formation of an accumulation layer of first conductivity type charge carriers in the diamond active region 14, at the second face 12b. However, in accordance with the present invention, an intrinsic or semiconducting carbide interfacial layer 20 (e.g., SiC, TiC, WC) is provided at the second face 12b as illustrated. This carbide interfacial layer 20 reduces parasitic conduction of the first conductivity type charge carriers from the diamond active region 14 to the insulating region 22 as compared to a conventional MIS field effect device which has an insulating layer on a semiconducting diamond active region, but does not have a carbide interfacial layer therebetween.

Although not wishing to be bound by any theory, it is believed by the inventors herein that the presence of the carbide interfacial layer 20 inhibits the formation of electrically active defects, such as interface states, by improving the chemical bonding between the diamond active region 12 and the insulating layer 22. The carbide interfacial layer 20 has also been found to improve the adhesion between an insulating layer 22 of oxide (e.g., SiO$_2$) and the diamond active region 12. These benefits can be expected to be observed in CV-curves of MIS capacitors fabricated in accordance with the present invention. In particular, both the "stretchout" and frequency dependency of CV-curves of conventional MIS capacitors should be improved by using a carbide interfacial layer 20 between the diamond active region 14 and insulating layer 22 of the MIS capacitor 10.

Figure 2:
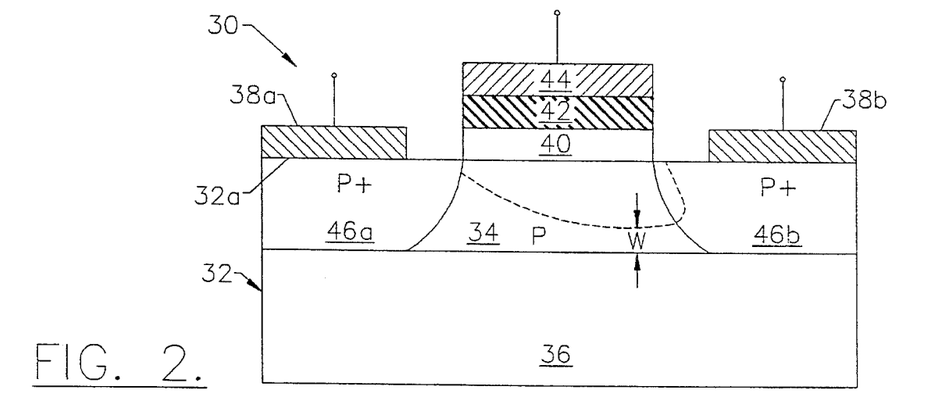
FIG. 2 is a schematic cross-sectional view of a buried-channel field effect transistor according to the invention.

Referring now to FIG. 2, a buried-channel (i.e., depletion-mode) field effect transistor 30 according to the invention preferably includes a substrate 32 having a face 32a and a semiconducting diamond active region 34 therein (shown as P-type). The substrate may also include a substrate insulating layer 36 such as intrinsic or undoped diamond on which the diamond active region 34 is formed. An MIS field effect structure including a carbide interfacial layer 40, an electrically insulating layer 42 and an electrically conductive layer 44 are also preferably formed adjacent the semiconducting diamond active region 34 in stacked relation, as illustrated. The insulating layer 42 and conductive layer 44 collectively form insulated biasing means which acts as an insulated-gate electrode for the transistor 30. The semiconducting diamond active region 34 also includes spaced-apart source and drain regions 46a–b (shown as P$^+$) having respective source and drain ohmic contacts 38a–b.

As will be understood by those skilled in the art, the application of an appropriate bias to the insulated-gate electrode modulates the conductivity of the diamond active region 34 by controlling the width "W" of a buried-channel (shown by dotted lines) adjacent the substrate insulating layer 36. According to a preferred embodiment of the present invention, the carbide interfacial layer 40 is silicon carbide having a thickness in the range of about one monolayer to 10 μm and more preferably in the range of 10–10,000 Å. The silicon carbide layer may be intrinsic silicon carbide or may be semiconducting silicon carbide of second conductivity type (e.g., N-type) to thereby form a P—N silicon carbide/diamond heterojunction at the face 32a. The insulated-gate electrode also preferably includes a metal or a relatively highly doped semiconductor region on an oxide such as silicon dioxide.

Figure 3:
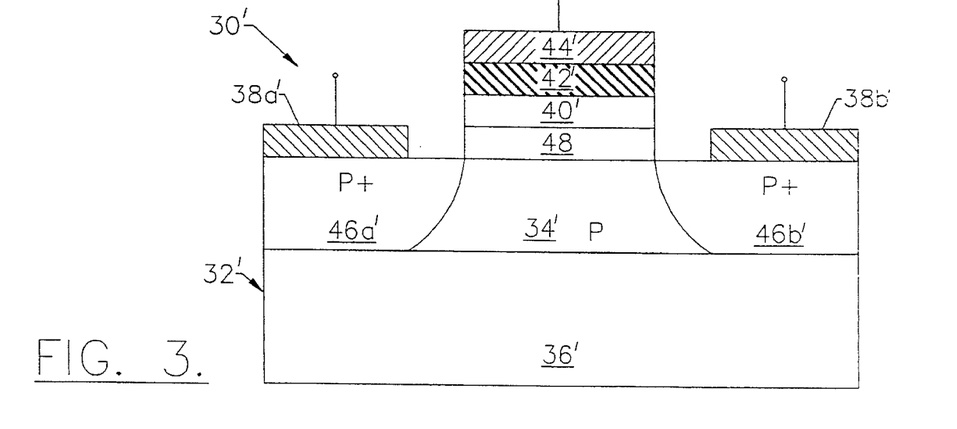
FIG. 3 is a schematic cross-sectional view of another buried-channel field effect transistor according to the invention.

Referring now to FIG. 3, another buried-channel field effect transistor 30' according to the present invention is illustrated. The transistor 30' is similar to the field effect transistor 30 of FIG. 2, however, an additional insulating layer 48, such as intrinsic diamond, is provided between the diamond active region 34' and the carbide interfacial layer 40'. The insulating layer 48 provides additional interface trap and/or leakage current reductions and also prevents out-diffusion of dopants from the diamond active region 34' to the carbide interfacial layer 40' during processing.

Figure 4:
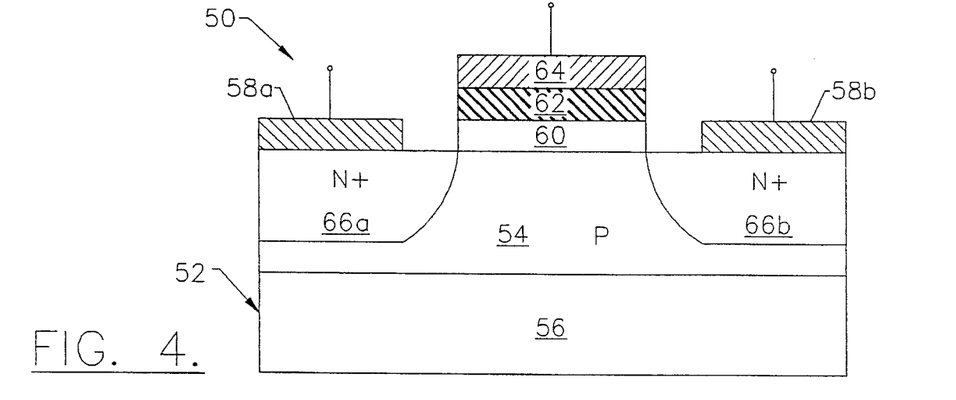
FIG. 4 is a schematic cross-sectional view of an enhancement-mode field effect transistor according to the invention.

FIG. 4 illustrates a complementary device to the field effect transistor 30 of FIG. 2. In particular, an enhancement-mode field effect transistor 50 is illustrated in FIG. 4 which preferably includes a substrate 52 having a semiconducting diamond active region 54 therein (shown as P-type). The substrate may also include a substrate insulating layer 56 such as intrinsic diamond on which the diamond active region 54 is formed. An MIS field effect structure including a carbide interfacial layer 60, an electrically insulating layer 62 and an electrically conductive layer 64 are also preferably formed adjacent the semiconducting diamond active region 54, as illustrated. The insulating layer 62 and conductive layer 64 collectively form an insulated-gate electrode for the transistor 50. The semiconducting diamond active region 54 also includes spaced-apart source and drain regions 66*a–b* (shown as $N^+$) having respective source and drain ohmic contacts 58*a–b*.

As will be understood by those skilled in the art, the application of an appropriate bias to the insulated-gate electrode modulates the conductivity of the diamond active region 54 by controlling the formation of an N-type inversion-layer channel in the diamond active region 54. This inversion-layer channel electrically connects the source and drain regions 66*a–b*, upon the application of a sufficient bias. According to a preferred embodiment of the present invention, the carbide interfacial layer 60 is silicon carbide having a thickness in the range of about 10–10,000 Å. Moreover, the interfacial layer may be intrinsic carbide or semiconducting carbide of second conductivity type (e.g., N-type) to thereby form a P—N carbide/diamond heterojunction. The insulated-gate electrode also preferably includes a metal or relatively highly doped semiconductor region on an oxide such as silicon dioxide.

Figure 5:
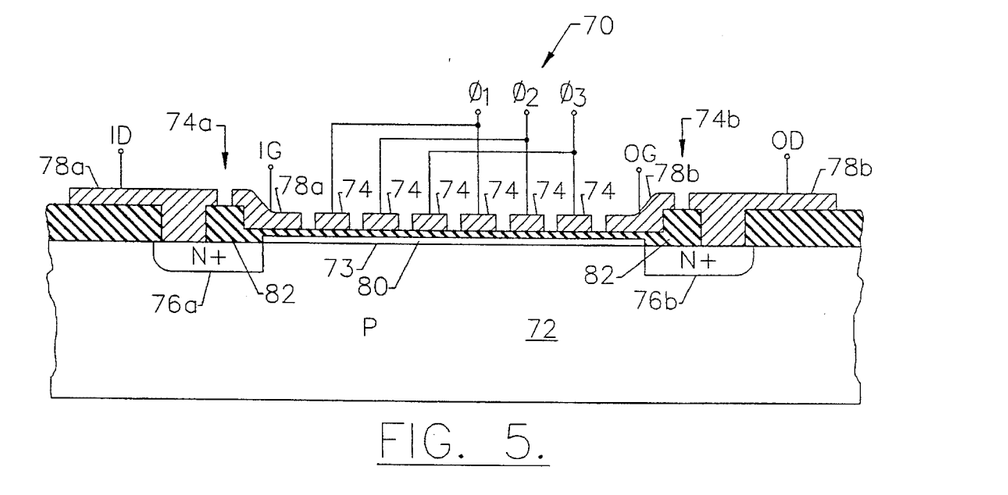
FIG. 5 is a schematic cross-sectional view of a surface-channel charge-coupled device according to the invention.

Referring now FIG. 5, a 3-phase surface-channel charge-coupled device (CCD) 70 according to the invention is illustrated. The device 70 includes a diamond active region 72 of first conductivity type (shown as P-type) and respective gate controlled input and output diodes 74*a* and 74*b*. The input and output diodes 74*a–b* have regions of second conductivity type 76*a* and 76*b* (shown as $N^+$) for injecting packets of second conductivity type charge carriers into the active region 72 in response to the application of appropriate gate biases to input and output gates 78*a* and 78*b*. Regions 76*a–b* also ohmically contact input and output electrodes 78*a–b*, as illustrated. As will be understood by those skilled in the art, a CCD of other numbers of phases is also contemplated by the invention and the packets of charges carriers may also be generated by ultraviolet (UV) radiation so that the device 70 forms a UV CCD.

A carbide interfacial layer 80, such as silicon carbide, and an electrically insulating layer 82, such as silicon dioxide, are also provided on the diamond active region 72. The carbide interfacial layer 80 improves the transfer efficiency of the injected packets of charge carriers by inhibiting the formation of interface states at the face 73 and thereby preventing the leakage of the charge carriers parallel to the face 73 or into insulating layer 82. A plurality of electrically conductive layers 74 are also provided on the insulating layer 82 to allow independent control of the conductivity of respective portions of the diamond active region 72, in response to the application of respective bias signals to control electrodes $\phi_{1-3}$. As will be understood by those skilled in the art, upon the injection of second conductivity type charge carriers by the gate controlled input diode 74*a*, sequential control of the electrodes $\phi_{1-3}$ can be performed to transfer the injected charge carriers across the diamond active region 72 and to the output diode 74*b*.

Figure 6:
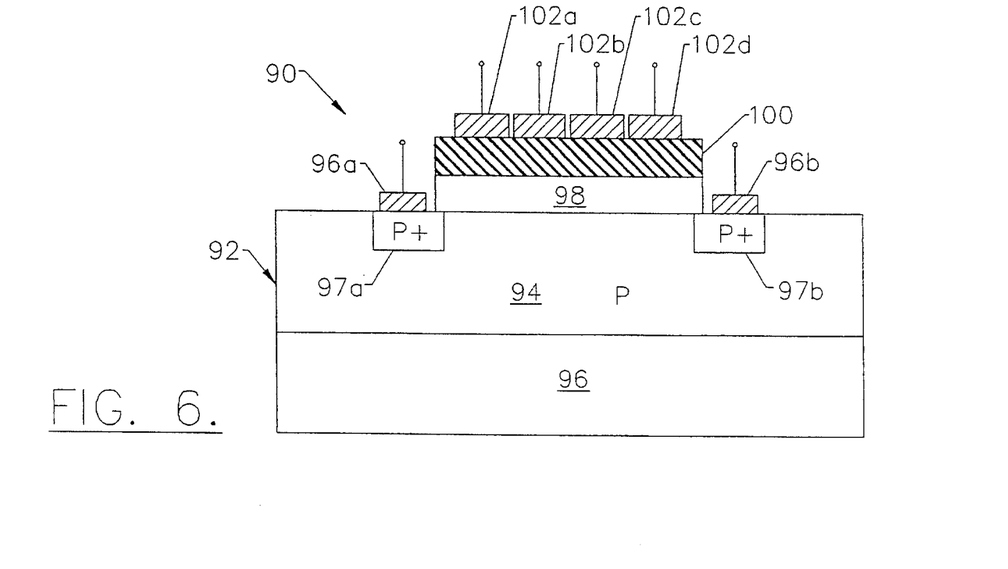
FIG. 6 is a schematic cross-sectional view of a buried-channel charge-coupled device according to the invention.

A buried-channel charge-coupled device 90 according to the invention is also illustrated in FIG. 6. The device 90 preferably includes a substrate 92 having a semiconducting diamond active region 94 therein (shown as P-type). The substrate 92 may also include a substrate insulating layer 96 such as intrinsic diamond on which the diamond active region 94 is formed. Input and output contacts 96*a* and 96*b* have adjacent regions of second conductivity type 97*a* and 97*b* (shown as $P^+$). An MIS field effect structure including a carbide interfacial layer 98, an electrically insulating layer 100 and a plurality of control electrodes 102*a–d* are also preferably formed adjacent the semiconducting diamond active region 94, as illustrated.

Figure 7:
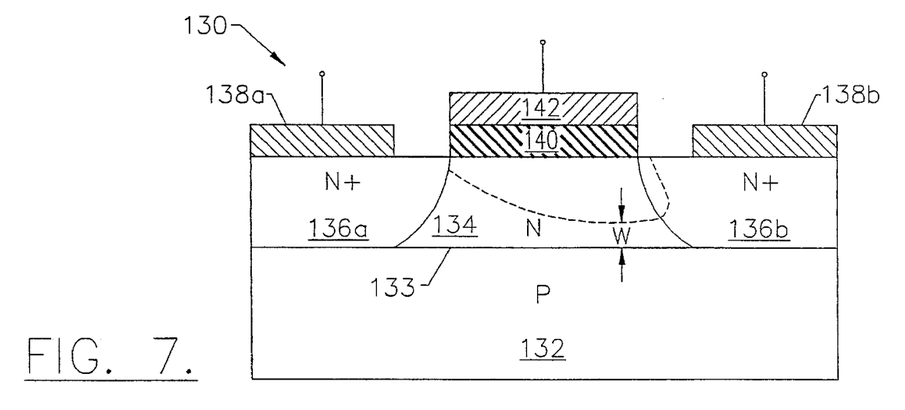
FIG. 7 is a schematic cross-sectional view of a heterojunction field-effect transistor according to the invention.

A buried-channel field effect transistor 130 having a carbide active region and a carbide/diamond heterojunction according to the invention is also illustrated in FIG. 7. The transistor 130 includes a semiconducting diamond layer 132 of first conductivity type (shown as P-type) and a semiconducting carbide active region 134 of second conductivity type (shown as N-type) thereon. Source and drain regions 136*a–b* and respective source and drain contacts 138*a–b* are also provided as illustrated. The transistor 130 also includes an insulated-gate electrode formed by an electrically insulating layer 140 and conductive gate electrode 142. As will be understood by those skilled in the art, the application of an appropriate gate bias to the insulated-gate electrode modulates the conductivity of the carbide active region 134 by controlling the width "W" of a buried-channel (shown by dotted lines) adjacent the semiconducting diamond layer 132, which forms a P—N heterojunction with the carbide active layer 134 at an interface 133. As described above, the carbide active layer 134 inhibits the formation of electrically active defects at the interface 133 and improves the channel characteristics of the buried-channel device 130.

Figure 8A:
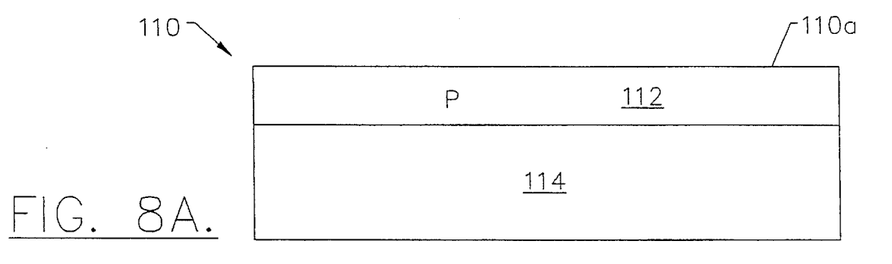
FIGS. 8A–8E are schematic cross-sectional views of intermediate structures illustrating a method of forming a diamond semiconductor device according to an embodiment of the present invention.

Referring now to FIGS. 8A–8E, a preferred embodiment of a method of forming a diamond semiconductor device having parasitic conduction inhibiting means is illustrated. Referring to FIG. 8A, the method begins with the step of forming a diamond layer 110 containing a semiconducting diamond active region 112 of first conductivity type, shown as P-type, therein. As illustrated, the diamond layer 110 may also include an intrinsic (i.e., insulating) diamond region 114 as a substrate, adjacent the diamond active region 112. The insulating diamond region 114 preferably includes (100) oriented, type IIa diamond. As will be understood by those skilled in the art, the diamond active region 112 may be formed by implanting a suitable dopant such as boron (B) into an intrinsic diamond substrate at a face 110*a* or by depositing a semiconducting diamond active region 112 on the face of an intrinsic diamond substrate by plasma-assisted CVD. Other techniques known to those skilled in the art may also be used to form the semiconducting diamond active region 112. These steps are then followed by the step of cleaning the diamond layer 110 in a saturated solution of Cr or $(NH_4)_2S_2O_8$ in $H_2SO_4$ and subsequently rinsing the face using a 1:1 solution of $H_2O_2$ and $NH_4OH$. Standard RCA, dry etching and electrochemical cleaning techniques can also be used.

Figure 8B:
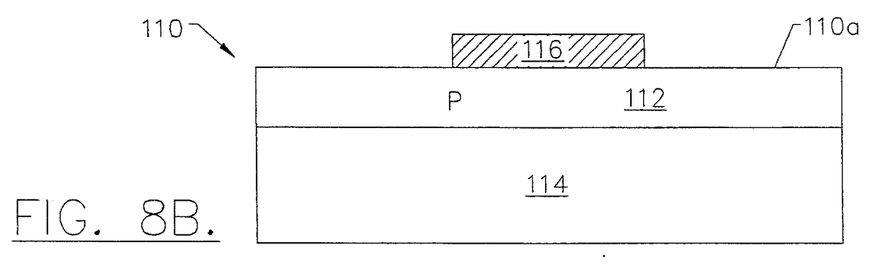

Referring now to FIG. 8B, a carbide interfacial layer 116 is then formed on the diamond layer 110. This step can include the steps of: (i) forming a layer of carbide forming material such as silicon (Si), or a refractory metal such as titanium (Ti) or tungsten (W) on the diamond layer 110; and then (ii) converting the carbide forming material to a respective carbide (e.g., SiC, TiC or WC). For example, a 2000 Å of silicon can be deposited onto the diamond layer 110 and then an annealing step can be performed at 1000° C. for 60 min. and then at 1200° C. for 30 min. in vacuum ($1\times10^{-7}$ Torr). Alternatively, one of the aforementioned carbides can be deposited directly on the semiconducting diamond active region 112.

Figure 8C:
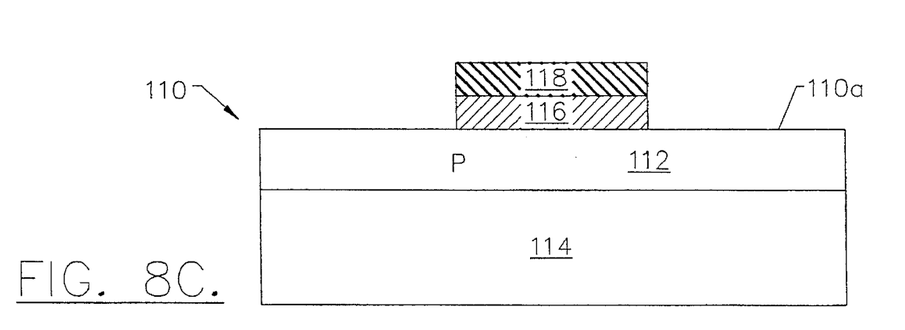

Referring now to FIG. 8C, an electrically insulating layer 118 is preferably formed on the carbide interfacial layer 116. As noted above, the thickness of the carbide interfacial layer 116 is relatively thin to promote adhesion of the insulating layer 118 to the diamond layer 110. The electrically insulating layer 118 may be intrinsic diamond, an oxide such as $SiO_2$ and $TiO_2$, or a similar dielectric. An oxide such as $SiO_2$ can also be thermally grown on a silicon carbide interfacial layer or the insulating layer can be formed by evaporation, sputtering, CVD or PVD techniques. Alternatively, the steps of forming a carbide interfacial layer 116 and forming an electrically insulating layer 118 can be performed simultaneously by first depositing a material (e.g., Si) which is capable of forming both a carbide and an oxide and then converting this material to a carbide layer (e.g., SIC), adjacent the diamond layer 110, and also to an oxide layer (e.g., $SiO_2$) on the carbide layer.

Figure 8D:
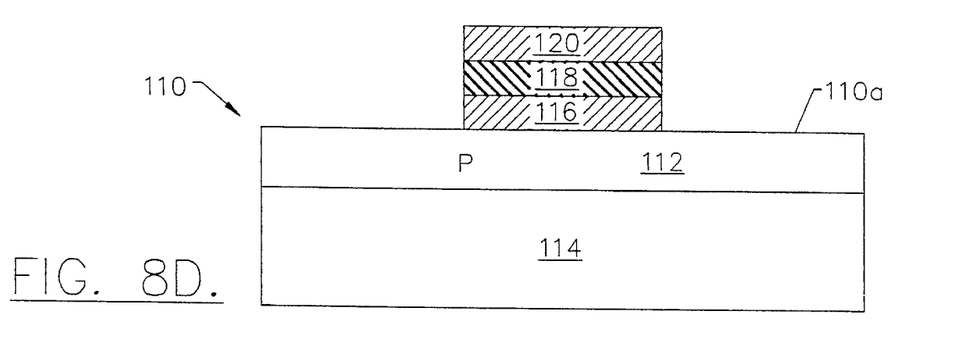

As illustrated in FIG. 8D, an electrically conductive layer 120 is preferably formed on the electrically insulating layer 118, opposite the carbide interfacial layer 116. The conductive layer 120 can include any one of a number of metals selected from the group consisting of gold, aluminum, platinum, titanium and alloys thereof. Alternatively, the conductive layer 120 can include a relatively highly doped semiconductor such as silicon or diamond.

Figure 8E:
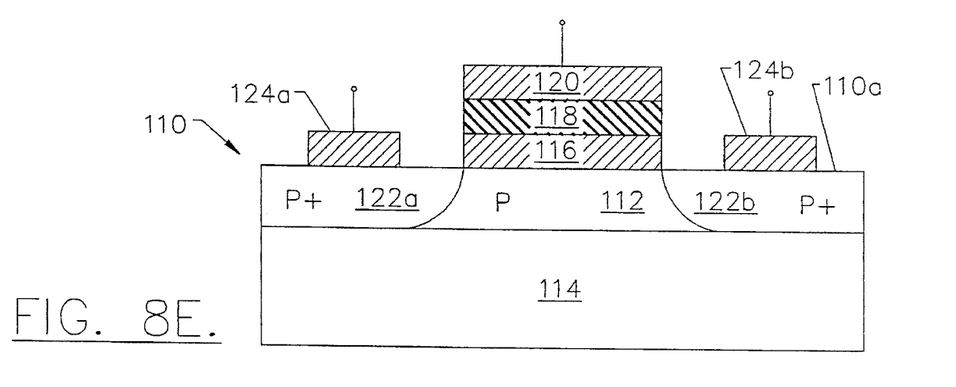
Figure 9A:
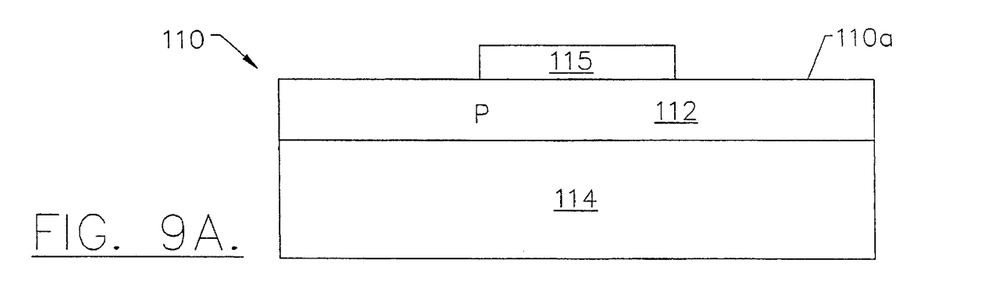
FIGS. 9A–9E are schematic cross-sectional views of intermediate structures illustrating a method of forming a diamond semiconductor device according to another embodiment of the present invention.
Figure 9B:
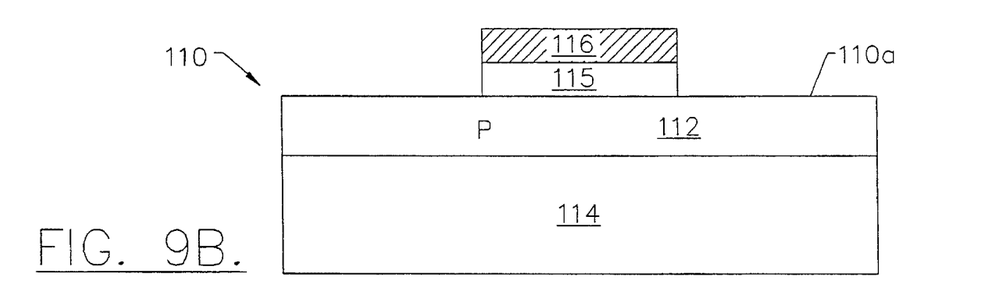
Figure 9C:
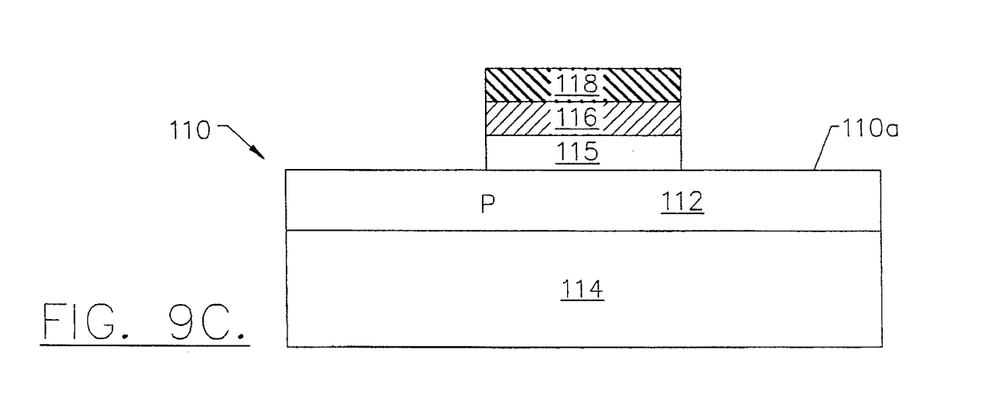
Figure 9D:
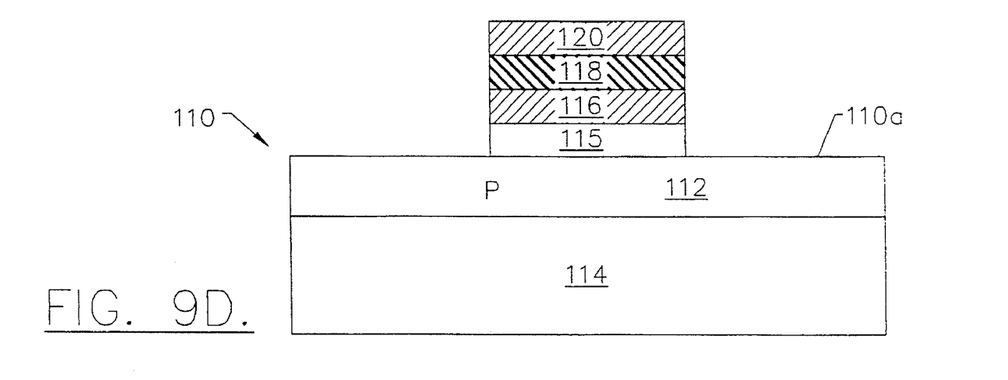
Figure 9E:
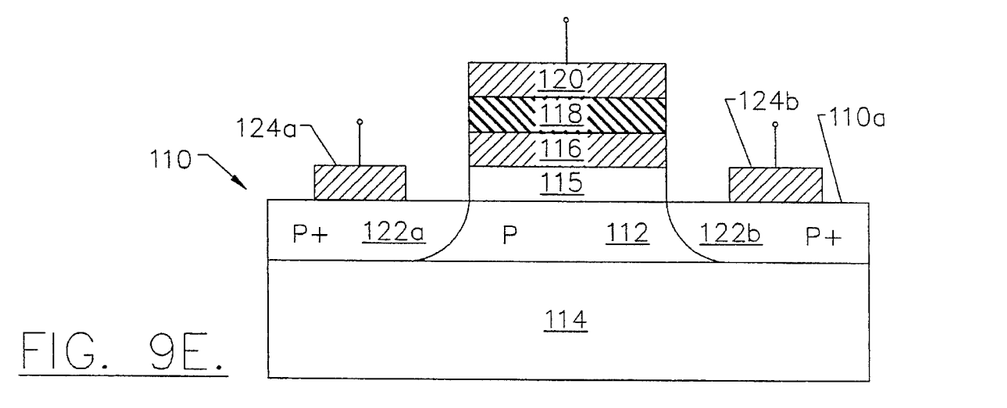

As described above, the diamond semiconductor device of FIG. 8D can be used to form a variety of diamond electronic devices. For example, the device of FIG. 8D can be used to form MIS capacitors, enhancement-mode or buried-channel insulated-gate field effect transistors (IGFETs), charge-coupled devices (CCDs) and other related diamond devices having MIS structures thereon. Referring now to FIG. 8E, the device of FIG. 8D can be used to form an exemplary buried-channel field effect transistor by forming $P^{++}$ (or degenerately doped) source and drain regions 122a–b adjacent the MIS insulated-gate structure (regions 116–120) and forming ohmic source and drain contacts 124a–b thereto, using conventional process techniques.

Referring now to FIGS. 9A–9E, the steps of forming a buried-channel field effect transistor according to another embodiment of the present invention will be described. The steps of FIGS. 9A–9E are similar to the steps of FIGS. 8A–8E, however, the step of forming a carbide interfacial layer 116 is preceded by the step of forming an intrinsic diamond layer 115 on the semiconducting diamond active region 112. The diamond layer 115 provides additional interface trap and/or leakage current reductions and also prevents out-diffusion of dopants from the diamond active region 112 to the carbide interfacial layer 116 during processing. Accordingly, the MIS insulated-gate structure includes a conductor/insulator/carbide/intrinsic diamond structure (regions 115–120) on a semiconducting diamond active region 112.

In the drawings and specification, there have been disclosed typical preferred embodiments of the invention and, although these preferred embodiments have been generally illustrated as lateral devices, vertical device structures are also contemplated by the invention. Moreover, although specific terms have been used throughout the specification, they are used in a generic and descriptive sense only and not for purposes of limitation, the scope of the invention being set forth in the following claims.

That which is claimed:

1. A semiconductor device comprising:
   a diamond layer having a semiconducting diamond active region therein containing first conductivity type charge carriers; and
   an insulated electrode on said diamond layer, said insulated electrode including an electrically insulating layer on said diamond layer; an electrically conductive layer on said electrically insulating layer so that the application of a potential bias thereto modulates an electrical conductivity of said diamond active region while said electrically insulating layer prevents conduction of the first conductivity type charge carriers from said modulated diamond active region to said electrically conductive layer; and a carbide interfacial layer between said diamond layer and said electrically insulating layer.

2. A semiconducting device according to claim 1 wherein said carbide interfacial layer extends between said semiconducting diamond active region and said electrically insulating layer.

3. A semiconducting device according to claim 1 wherein said diamond layer comprises an undoped diamond layer between said semiconducting diamond active region and said carbide interfacial layer.

4. A semiconducting device according to claim 1 wherein said carbide interfacial layer has a thickness no greater than about 10,000 Å to thereby promote adhesion between said diamond layer and said electrically insulating layer.

5. A semiconducting device according to claim 1 wherein said carbide interfacial layer is selected from the group consisting of silicon carbide and refractory metal carbides.

6. A semiconducting device according to claim 1 wherein said electrically insulating layer comprises an oxide selected from the group consisting of silicon dioxide and titanium dioxide.

7. A semiconducting device according to claim 1 wherein said electrically insulating layer comprises undoped diamond.

8. A semiconducting device according to claim 1 wherein said carbide interfacial layer comprises semiconducting silicon carbide of opposite conductivity type to said semiconducting diamond active region so that the semiconductor device defines a heterojunction semiconductor device.

9. A semiconducting device according to claim 8 wherein said diamond layer further comprises spaced apart source and drain semiconducting regions adjacent said semiconducting diamond active region so that the semiconductor device defines a field effect transistor having a P—N heterojunction.

10. A semiconducting device according to claim 1 wherein said diamond layer further comprises spaced apart source and drain semiconducting regions adjacent said semiconducting diamond active region so that the semiconductor device defines a field effect transistor.

11. A semiconductor device according to claim 1 wherein said semiconducting diamond active region extends to a face of said diamond layer, wherein said diamond layer further comprises spaced-apart source and drain semiconducting regions adjacent said semiconducting diamond active region, and wherein said spaced-apart source and drain regions and said semiconducting diamond active region are of first conductivity type so that the semiconductor device defines a buried-channel field effect transistor.

12. A semiconductor device according to claim 1 wherein said semiconducting diamond active region extends to a face of said diamond layer, wherein said diamond layer further comprises spaced-apart source and drain semiconducting regions adjacent said semiconducting diamond active region, and wherein said spaced-apart source and drain regions are of opposite conductivity type to said semiconducting diamond active region so that the semiconductor device defines an enhancement-mode field effect transistor.

13. A semiconductor device according to claim 1 wherein said diamond layer further comprises spaced-apart input and output regions of first conductivity type therein, and wherein said electrically conductive layer comprises a plurality of adjacent control electrodes on said electrically insulating layer, opposite said carbide interfacial layer, so that the semiconductor device defines a buried-channel charge-coupled device.

14. A semiconductor device according to claim 1 wherein said diamond layer further comprises spaced-apart input and output diodes adjacent said semiconducting diamond active region of opposite conductivity type to said semiconducting diamond active region; and wherein said electrically conductive layer comprises a plurality of adjacent conductive electrodes on said electrically insulating layer, opposite said carbide interfacial layer, so that the semiconductor device defines a surface-channel charge-coupled device.

15. A semiconductor device according to claim 1 wherein said carbide interfacial layer is silicon carbide; wherein said electrically insulating layer is undoped diamond; and wherein said electrically conductive layer is highly doped diamond.

16. A semiconductor device according to claim 1 wherein said carbide interfacial layer is of opposite conductivity type to said semiconducting diamond active region, and wherein said diamond layer further comprises spaced-apart source and drain regions adjacent said semiconducting diamond active region so that the semiconductor device defines a buried-channel heterojunction field effect transistor.

17. A semiconductor device according to claim 1 wherein said carbide interfacial layer is of opposite conductivity type to said semiconducting diamond active region and forms a P—N heterojunction therewith.

18. A semiconductor device comprising:
a diamond layer having a semiconducting diamond active region therein;
insulated biasing means on said diamond layer for establishing an accumulation layer of charge carriers in said semiconducting diamond active region in response to application of a potential bias to said insulated biasing means; and
parasitic conduction inhibiting means between said semiconducting diamond active region and said insulated biasing means for inhibiting parasitic conduction of the charge carriers from the accumulation layer to said insulated biasing means upon application of the potential bias;
wherein said insulated biasing means includes an electrically conductive layer, and an electrically insulating layer for preventing conduction of the charge carriers from said parasitic conduction inhibiting means to said electrically conductive layer.

19. A semiconducting device according to claim 18 wherein said parasitic conduction inhibiting means comprises a carbide interfacial layer which inhibits the formation of electrically active defects between said semiconducting diamond active region and said insulated biasing means.

20. A semiconducting device according to claim 18 wherein said semiconducting diamond active region extends to a face of said diamond layer; wherein said diamond layer further comprises spaced-apart source and drain regions adjacent said semiconducting diamond active region; wherein said insulated biasing means comprises means adjacent said semiconducting diamond active region for establishing an accumulation layer of charge carriers therein in response to a first potential bias, and for depleting said semiconducting diamond active region of charge carriers in response to a second potential bias opposite said first potential bias; and wherein said parasitic conduction inhibiting means comprises means between said semiconducting diamond active region and said insulated biasing means for inhibiting parasitic conduction of the charge carriers between said semiconducting diamond active region and said insulated biasing means upon the application of the first potential bias, and for inhibiting parasitic conduction between said drain region and said source region upon application of the second potential bias.

21. A semiconducting device according to claim 20 wherein said parasitic conduction inhibiting means comprises a carbide interfacial layer on said channel region and on said source and drain regions.

22. A semiconducting device according to claim 19 wherein said carbide interfacial layer is of opposite conductivity type to said semiconducting diamond active region and forms a P—N heterojunction therewith.

23. A semiconductor device comprising:
a diamond layer having a semiconducting active region therein; and
an insulated electrode on said diamond layer, said insulated electrode including
an electrically insulating layer on said diamond layer, said electrically insulating layer comprising an oxide of a predetermined material also capable of forming a carbide and having a sufficient thickness to prevent electrical conduction therethrough when said insulated electrode is biased to a first potential relative to said diamond layer;
an electrically conductive layer on said electrically insulating layer; and
a carbide interfacial layer between said diamond layer and said electrically insulating layer, said carbide interfacial layer comprising a carbide of said predetermined material.

24. A semiconducting device according to claim 23 wherein said carbide interfacial layer has a thickness in a range of about 10 to 10,000 Å.

25. A semiconducting device according to claim 23 wherein said diamond layer further comprises spaced apart source and drain semiconducting regions adjacent said semiconducting diamond active region so that the semiconductor device defines a field effect transistor.

26. A semiconducting device according to claim 23 wherein said carbide interfacial layer comprises semiconducting silicon carbide of opposite conductivity type to said semiconducting diamond active region so that the semiconductor device defines a heterojunction semiconductor device.

* * * * *